(12) United States Patent
Urakabe et al.

(10) Patent No.: US 7,660,094 B2
(45) Date of Patent: Feb. 9, 2010

(54) INVERTER CIRCUIT

(75) Inventors: Takahiro Urakabe, Tokyo (JP);
Takamasa Asai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 371 days.

(21) Appl. No.: 11/010,262

(22) Filed: Dec. 14, 2004

(65) Prior Publication Data
US 2006/0126253 A1 Jun. 15, 2006

(51) Int. Cl.
*H01C 7/12* (2006.01)
(52) U.S. Cl. .................................. 361/118; 361/111
(58) Field of Classification Search ........... 361/118, 361/111
See application file for complete search history.

(56) References Cited

U.S. PATENT DOCUMENTS

| | | | | |
|---|---|---|---|---|
| 4,864,479 | A * | 9/1989 | Steigerwald et al. | 363/17 |
| 5,227,655 | A * | 7/1993 | Kayama | 257/380 |
| 5,612,582 | A * | 3/1997 | Shichi et al. | 307/130 |
| 5,818,281 | A * | 10/1998 | Ohura et al. | 327/381 |
| 7,015,774 | B2 * | 3/2006 | Terakawa et al. | 333/181 |
| 7,206,179 | B2 * | 4/2007 | Miyamoto | 361/118 |
| 2002/0105316 | A1 * | 8/2002 | Takahashi | 324/98 |
| 2004/0027762 | A1 * | 2/2004 | Ohi et al. | 361/100 |

FOREIGN PATENT DOCUMENTS

| | | |
|---|---|---|
| EP | 0 703 664 A2 | 3/1996 |
| JP | 53-108760 | 9/1978 |
| JP | 2003-23768 A | 1/2003 |

OTHER PUBLICATIONS

Japanese Office Action for Application No. 2003-194142, dispatched Nov. 20, 2007.
Ulrich Tietze and Christoph Schenk, Halbleiter-Schaltungstechnik (Semiconductor Circuitry), Berlin; Heidelberg; New York; Barcelona; Hong Kong; Milan; Paris; Tokyo: Springer (2002), 12th ed., p. 1537.
Office Action dated Sep. 1, 2005 issued by German Patent Office (w/English translation).

* cited by examiner

*Primary Examiner*—Ronald W Leja
*Assistant Examiner*—Christopher J Clark
(74) *Attorney, Agent, or Firm*—Sughrue Mion, PLLC

(57) ABSTRACT

In an inverter circuit configured with main circuit switches each having a control terminal and first and second main terminals through which the main current flows, and driving circuits each of which applies the driving voltage to the control terminal of each main circuit switch, and controls the main current in accordance with the voltage between the control terminal and the first main terminal, to switch the main circuit switch, between the main circuit switch and the driving circuit, noise-suppression circuits are provided, each of which is configured so as to detect fluctuations in the voltage between the first and the second main terminals of each main circuit switch, and, in accordance with the amplitude and the frequency of the detected voltage fluctuations, to bring to approximately zero the impedance across the control terminal and the first main terminal of each main circuit switch.

10 Claims, 12 Drawing Sheets

11,12: driving circuit 13,14: noise-suppression circuit

INVERTER CIRCUIT

BACKGROUND OF THE INVENTION

1. Field of the Invention

The present invention relates to inverter circuits, and particularly to the configuration of a circuit that suppresses noise generated by switching operations of a power semiconductor switch, and that prevents erroneous operations from occurring due to the noise.

2. Description of the Related Art

In a conventional inverter circuit, in order to suppress noise generated by switching operations, in a high-potential-side arm and a low-potential-side arm, each of which includes a semiconductor switch and a driving circuit for driving the semiconductor switch, a noise-suppression circuit is provided between the semiconductor switch and the driving circuit. Reference is made, for example, to FIG. 1 of Japanese Patent Publication 23768/2003. The noise-suppression circuit is, for example, series-connected between the gate and the emitter of a semiconductor switch (IGBT: insulated gate bipolar transistor), and configured with: diodes D101 and D102 that apply the driving direct-current voltage from the driving circuit; a first set of resistors R103 and R104 that divide the driving direct-current voltage; a first switch SW101 whose conduction is controlled by the divided driving direct-current voltage; a second set of resistors R100 and R102 that are series-connected between a power source and the emitter of the semiconductor switch (IGBT), and that divide the power source voltage according to the switching state of the first switch SW101; and a second switch SW102 whose conduction is controlled by the divided power source voltage. See Japanese Patent Publication 23768/2003 (Pages 4 and 5, and FIG. 1).

Because the conventional inverter circuit is configured as described above, there has been a problem in that, while the first switch SW101 in the noise-suppression circuit is ON, the positive and negative voltages of the power source Vcc for driving the gate are connected via the resistor R101 in the second set of resistors, so that the current flows, such that power loss occurs in the resistor R100 and the resistor generates heat.

In addition, if the value of the resistor R100 in the second set of resistors were set to a large value in order to reduce the heat generated, the switching time of the second switch SW102 would be prolonged. There has been another problem in that, when the inverter circuit is operated as an orthogonal transformation circuit of PWM (pulse width modulation) control type, for example, the all-off period (dead time) of the semiconductor switches in the high-potential and low-potential side semiconductor switches must be prolonged by the switching duration of the second switch SW102, which reduces the voltage utilization factor (the value of the ac voltage) for that duration.

SUMMARY OF THE INVENTION

The present invention has been made to resolve the problems described above, and aims to provide an inverter circuit in which heat generation of components in the noise-suppression circuit can be reduced, and extra time for driving the noise-suppression circuit is not required.

An inverter circuit according to the present invention includes: one or more main circuit switches having a control terminal, and first and second main terminals through which the main current flows; a driving circuit for each main circuit switch, for applying a driving voltage to the control terminal thereof, and controlling the main current in accordance with the voltage between the control terminal and the first main terminal, to switch each main circuit switch; and a noise-suppression circuit for each main circuit switch, between each main circuit switch and each driving circuit, configured so as to detect fluctuations in the voltage between the first and the second main terminals of each main circuit switch, and, in accordance with the amplitude and the frequency of the detected voltage fluctuations, to bring to approximately zero the impedance across the control terminal of each main circuit switch and the first main terminal of each main circuit switch.

DETAILED DESCRIPTION OF THE PREFERRED EMBODIMENTS

Embodiment 1

Hereinafter, Embodiment 1 of the present invention will be described in reference to the drawings.

Figure 1:
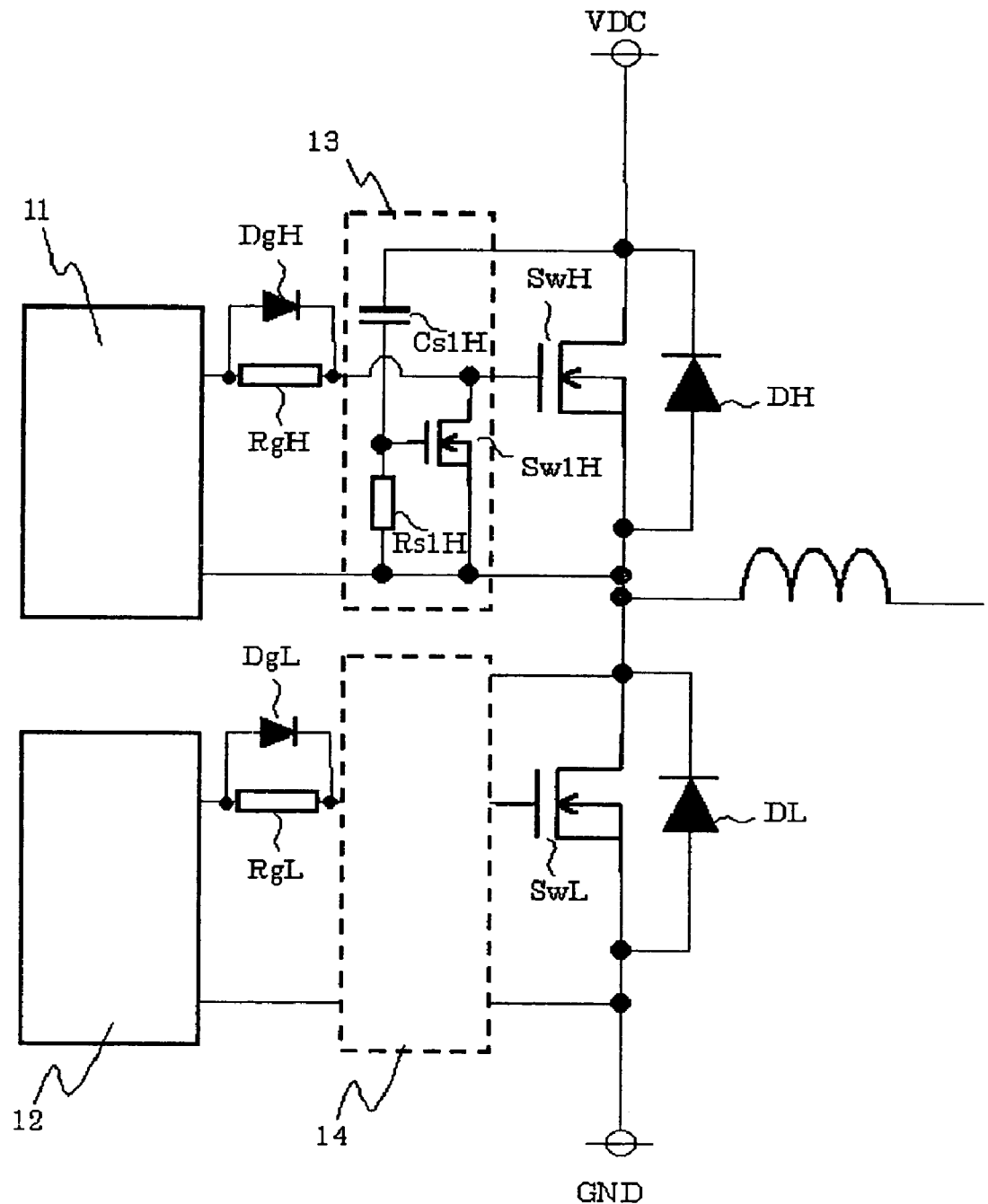
FIG. 1 is a circuit diagram illustrating an inverter circuit according to Embodiment 1 of the invention.

FIG. 1 is a circuit diagram illustrating an inverter circuit according to Embodiment 1 of the invention. In FIG. 1, the inverter circuit is configured with a high-potential-side arm and a low-potential-side arm. The high-potential-side arm includes a main circuit switch SwH consisting of a power MOSFET (metal oxide semiconductor field effect transistor), a driving circuit 11, and a noise-suppression circuit 13. The low-potential-side arm includes another main circuit switch SwL consisting of a power MOSFET, another driving circuit 12, and another noise-suppression circuit 14. Each of the main circuit switches SwH and SwL includes a control terminal (gate), and a first main terminal (source) and a second main terminal (drain) through which the main current flows. The driving circuits 11 and 12 apply the driving voltage to the control terminals of the main circuit switches SwH and SwL, respectively, and control the main currents that flow through the main circuit switches SwH and SwL, respectively, in accordance with the voltages between the respective control terminals and the respective first main terminals, to switch the main circuit switches. The noise-suppression circuit 13 is disposed between the main circuit switch SwH and the driving circuit 11, and the noise-suppression circuit 14 is disposed between the main circuit switch SwL and the driving circuit 12.

Moreover, a gate resistor RgH and a diode DgH for driving the gate are connected between the driving circuit 11 and the control terminal (gate) of the main circuit switch SwH, and another gate resistor RgL and another diode DgL for driving the gate are connected between the driving circuit 12 and the control terminal (gate) of the main circuit switch SwL.

Furthermore, the inverter circuit according to the present embodiment is to be connected to an inductive load; a reflux diode DH is connected to the main circuit switch SwH, and another reflux diode DL is connected to the main switch SwL. Here, "reflux" means that the current flows from the first main terminal to the second main terminal.

The main circuit switches SwH and SwL are series-connected. The connection point of the source of the main circuit switch SwH and the drain of the circuit main switch SwL is the output point, which is connected to an inductive load. The main circuit switch SwH and the main circuit switch SwL perform switching operations so as to apply the voltage VDC or the voltage GND to the output point.

The high-potential-side noise-suppression circuit 13 includes a first capacitor Cs1H having low impedance for high frequencies, a first resistor Rs1H, and a first semiconductor switch Sw1H consisting of a MOSFET. The first capacitor Cs1H and the first resistor Rs1H are connected in series. The series-connected body consisting of the first capacitor Cs1H and the first resistor Rs1H is connected between the two main terminals (the source and the drain) of the main circuit switch SwH. The control terminal (gate) of the first semiconductor switch Sw1H is connected to the connection point of the first capacitor Cs1H and the first resistor Rs1H. In addition, one main terminal (drain) out of the two main terminals (the source and the drain) of the first semiconductor switch Sw1H is connected to the control terminal (gate) of the main circuit switch SwH, and connected to the high-potential-side driving circuit 11 via the gate resistor RgH and the diode DgH. The other main terminal (source) of the first semiconductor switch Sw1H is connected to one of the main terminals (the first main terminal: source) of the main circuit switch SwH.

The low-potential-side noise-suppression circuit 14 has a configuration similar to that of the high-potential-side noise-suppression circuit 13, and includes a capacitor, a resistor, and a semiconductor switch.

A feature of the inverter circuit according to the invention lies in detecting high frequency voltage fluctuations—a noise source in switching—of the voltage between the two main terminals (the drain and the source) of the main circuit switch, and bringing to approximately zero the impedance across the control terminal of the main circuit switch and the first main terminal (source) of the main circuit switch in accordance with the amplitude and the frequency of the detected voltage fluctuations, to suppress noise. In the present embodiment, the first capacitor and the first resistor, which are connected in series, detect fluctuations in the voltage between the two main terminals of the main circuit switch. The first resistor divides the voltage fluctuations, and puts the first semiconductor switch into operation depending on the divided voltage. More specifically, when the amplitude of the voltage fluctuations is large, the inverter circuit operates so as to bring to approximately zero the impedance across the gate and the source of the main circuit switch. In addition, the values of the first capacitor and the first resistor are set to predetermined values so that the first semiconductor switch cannot be put into operation by low-frequency voltage fluctuations.

Before specifically describing the operation, a phenomenon that occurs when the main circuit switch is turned off will be described while taking the high-potential-side main circuit switch as an example. For an inverter circuit connected to an inductive load, the turn-off operation has two modes, in which the reflux diode DH connected in parallel with the main circuit switch is in a reflux state, and in which the current flows from the drain to the source of the main circuit switch itself.

Figure 2:
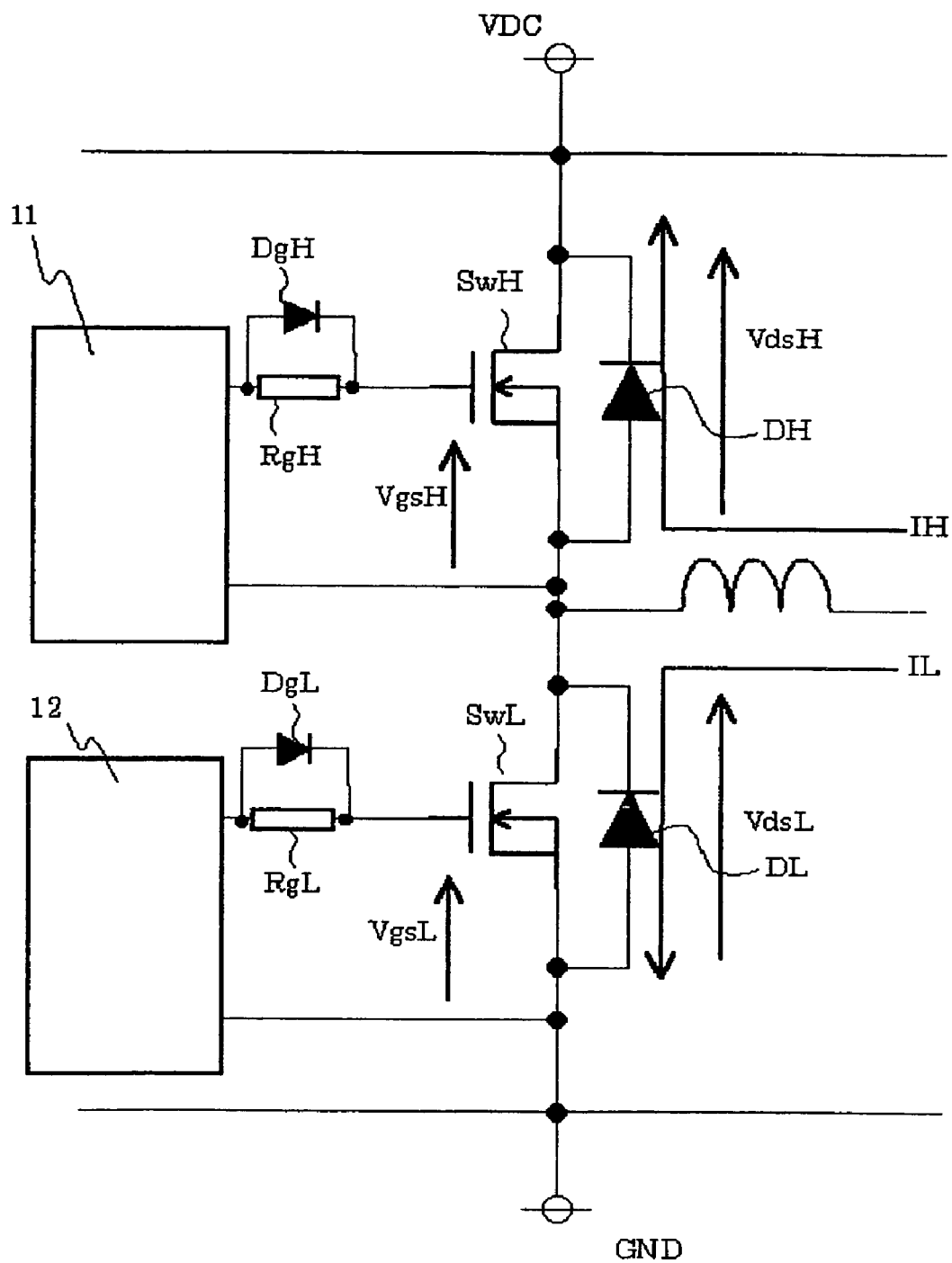
FIG. 2 is a diagram illustrating an operation when a main circuit switch is turned off, relevant to Embodiment 1 of the invention.
Figure 3:
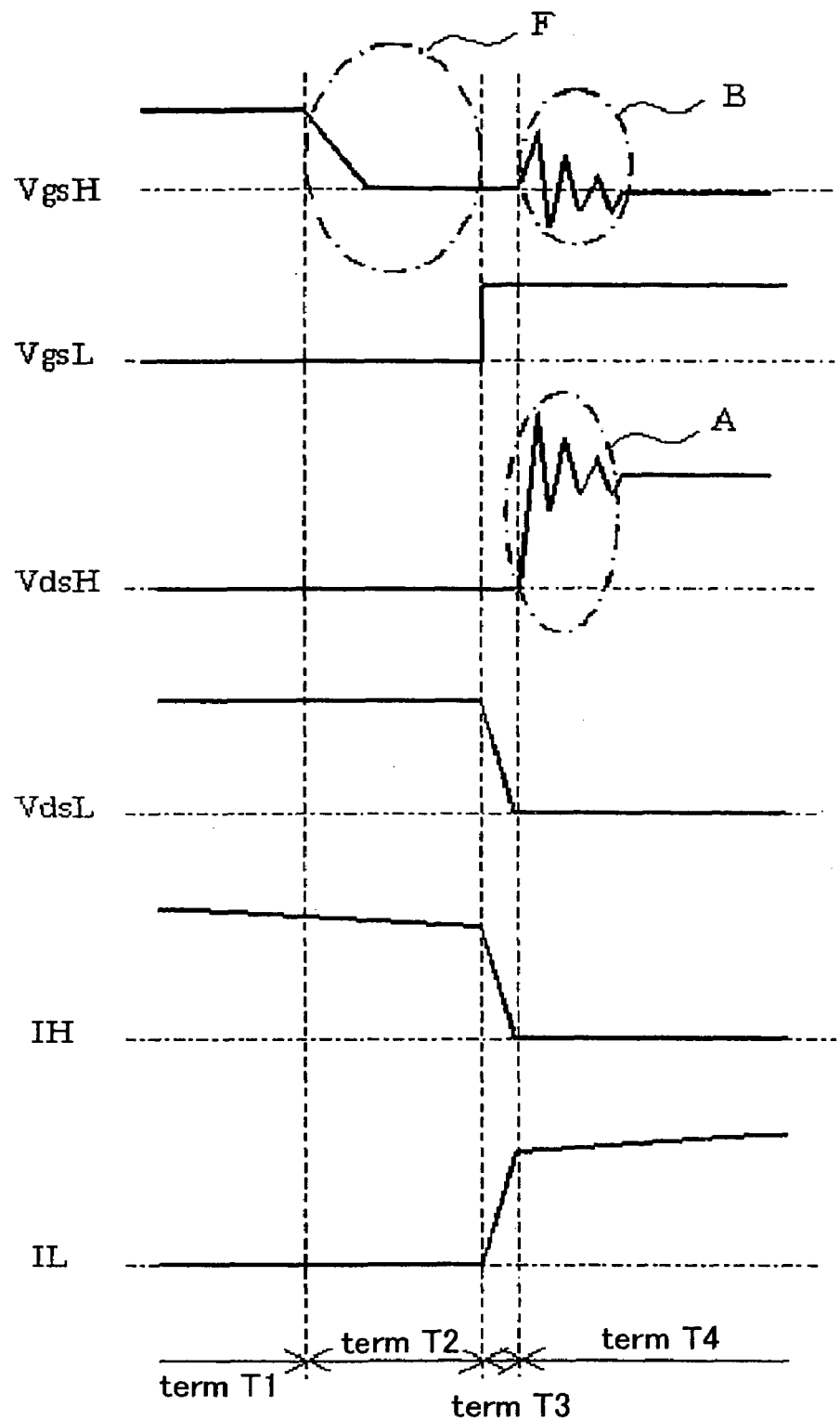
FIG. 3 is a wave form chart illustrating the operation when the main circuit switch is turned off, relevant to Embodiment 1 of the invention.

The turn-off operation when the reflux diode DH connected in parallel is in a reflux state will be described. FIG. 2 illustrates the configuration for one phase of an inverter circuit having no noise-suppression circuits 13 or 14, and FIG. 3 illustrates waveforms of voltages and currents in the circuit. VgsH and VdsH indicate the gate-source voltage and the drain-source voltage, respectively, of the high-potential-side main circuit switch SwH. VgsL and VdsL indicate the gate-source voltage and the drain-source voltage, respectively, of the low-potential-side main circuit switch SwL. IH indicates the sum of currents that flow through the switch SwH and the diode DH. IL indicates the current that flows through the switch SwL.

In FIG. 3, term T1 indicates a time when the current flows through the diode DH and the main circuit switch SwH in the direction illustrated in FIG. 2. The current is applied by the inductive load via a switch included in another phase of the inverter. In a term T2, VgsH comes to LOW voltage, and the main circuit switch SwH is turned off, while the current continues to flow through the reflux diode and a parasitic diode in the main circuit switch SwH. In term T3, VgsL comes to HIGH voltage, and the low-potential-side main circuit switch SwL switches from OFF state to ON state. The current that flows through the inductive load switches from the main circuit switch SwH to the main circuit switch SwL. As illustrated in FIG. 3, the current IH comes to zero, and the current IL increases. When the current IH is shut off, a parasitic capacitor, which has been in a zero voltage state, between the drain and the source of the main circuit switch SwH is charged via a parasitic inductance of the wiring (around several tens of nanohenries) by the direct-current power source, whose voltage is VDC. At this time, the resistive component of the wiring is so small that a vibration of several tens of megahertz (A in FIG. 3) is generated in the charged voltage between the drain and the source (term T4).

The high-frequency voltage vibration fluctuates the voltage between the gate and the source as well via the parasitic capacitor between the drain and the gate of the main circuit switch SwH. (B in FIG. 3) At this time, the gate of the main circuit switch SwH is connected within the driving circuit 11 to the source of the main circuit switch SwH via the gate resistor RgH, and if the impedance for high frequencies of this closed loop is extremely low, the fluctuations in the voltage between the gate and the source of the main circuit switch SwH can be suppressed. However, because the gate resistance of several tens of ohms is required for preventing off-surge described later), and the inductance of the wiring constituting the closed loop described above is several hundreds of nanohenries, fluctuations in the voltage between the gate and the source inevitably arises. If the voltage between the gate and source fluctuates and exceeds the threshold voltage of the gate of the main circuit switch SwH, the main circuit switch SwH is turned on erroneously. Consequently, because the low-potential-side main circuit switch SwL is in ON state, a short-circuit current flows, and the switch generates heat. If the temperature of the switch exceeds the rated temperature, the switch may break down.

Figure 4:
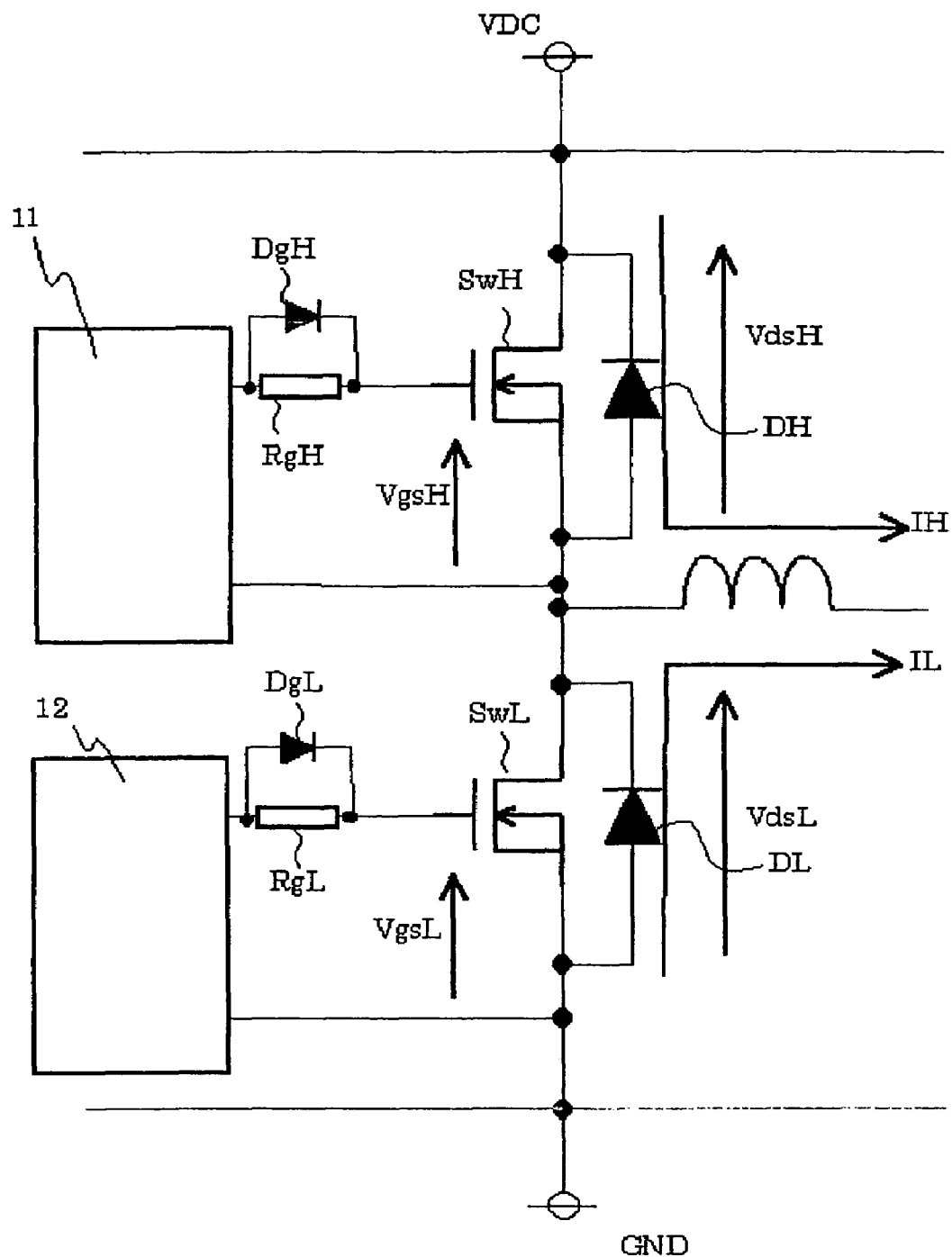
FIG. 4 is a diagram illustrating the operation when the main circuit switch is turned off, relevant to Embodiment 1 of the invention.

Next, the turn-off operation in a case in which the switch itself is in ON state and the current flows from the drain to the source will be described. FIG. 4 illustrates the configuration for one phase of the inverter circuit having no noise-suppression circuits 13 or 14, and FIG. 5 illustrates waveforms of voltages and currents in the circuit.

Figure 5:
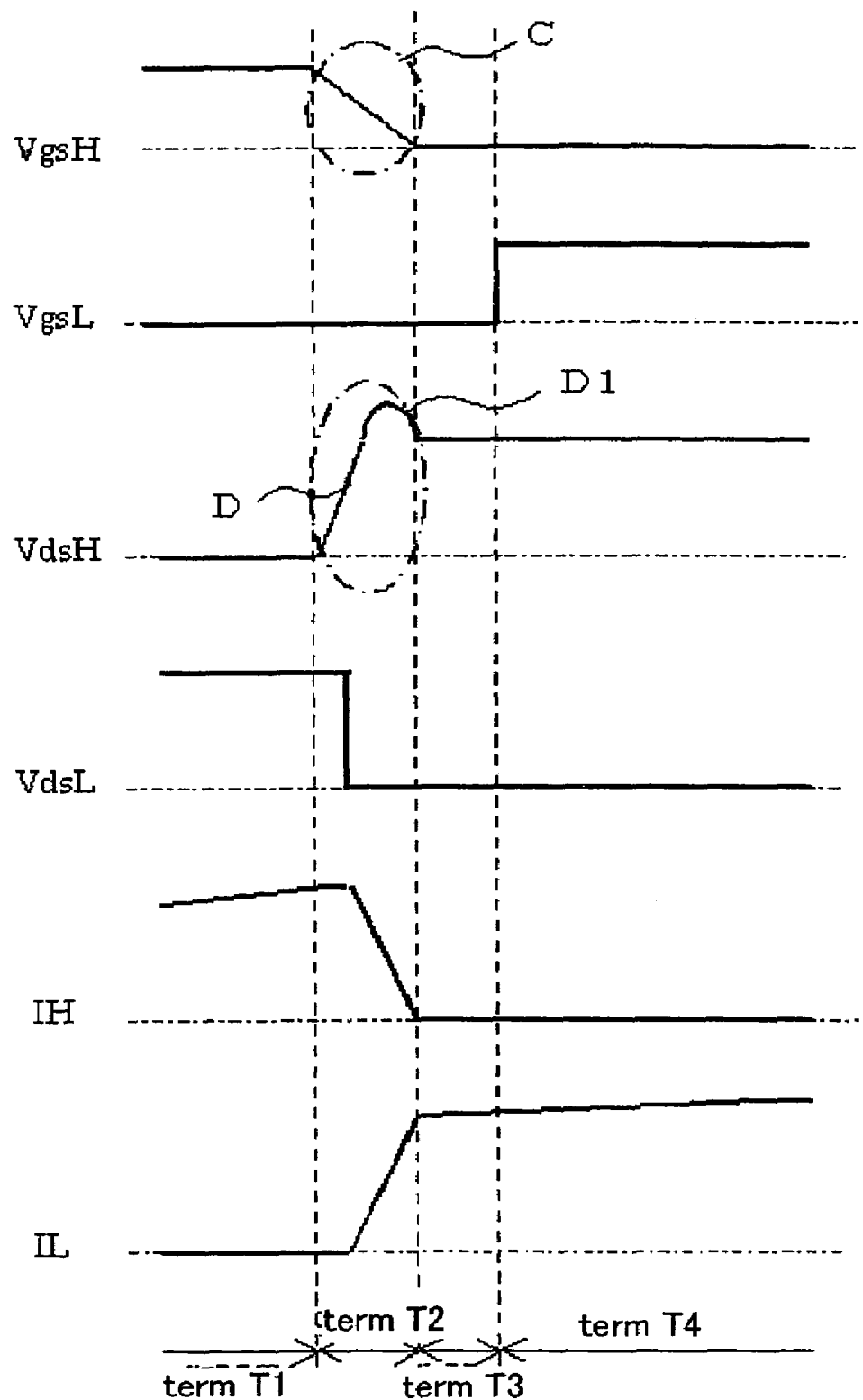
FIG. 5 is a wave form chart illustrating the operation when the main circuit switch is turned off, relevant to Embodiment 1 of the invention.

In FIG. 5, term T1 indicates a time when the current flows through the main circuit switch SwH in the direction illustrated in FIG. 4. In this term, the current flows from the power source to the inductive load. In a term T2, the output voltage of the high-potential-side driving circuit 11 comes to LOW voltage, and the electric charge accumulated in the gate capacitor of the main circuit switch SwH is slowly pulled out through the gate resistor RgH (C in FIG. 5). The voltage between the drain and the source of the main circuit switch SwH slowly increases (D in FIG. 5). The current IH decreases, and the current IL staffs to increase at the same time. The current IL at this time flows in the reflux diode DL and in the parasitic diode of the main circuit switch SwL. When the current IL staffs to flow, the voltage between the drain and the source of the main circuit switch SwL reaches approximately zero volts. In the term T2, because the main circuit switch SwH receives the energy charged in the parasitic inductance of the wiring, a surge voltage (D1 in FIG. 5) is generated between the drain and the source. The gate voltage of the main circuit switch SwH is slowly decreasing in order to consume the surge energy in the conductive resistance of the main circuit switch SwH and to suppress the surge voltage to a low level for preventing high-voltage breakdown of the component. In a term T3, the voltage between the drain and the source of the main circuit switch SwH has come to the voltage of the power source, and switching of the current from IH to IL has been completed. In a term T4, the voltage between the gate and the source of the low-potential-side main circuit switch SwL comes to HIGH voltage, and the current IL flows not only in the reflux diode DL and in the parasitic diode in the main circuit switch SwL, but also in the main circuit switch SwL itself.

Figure 6:
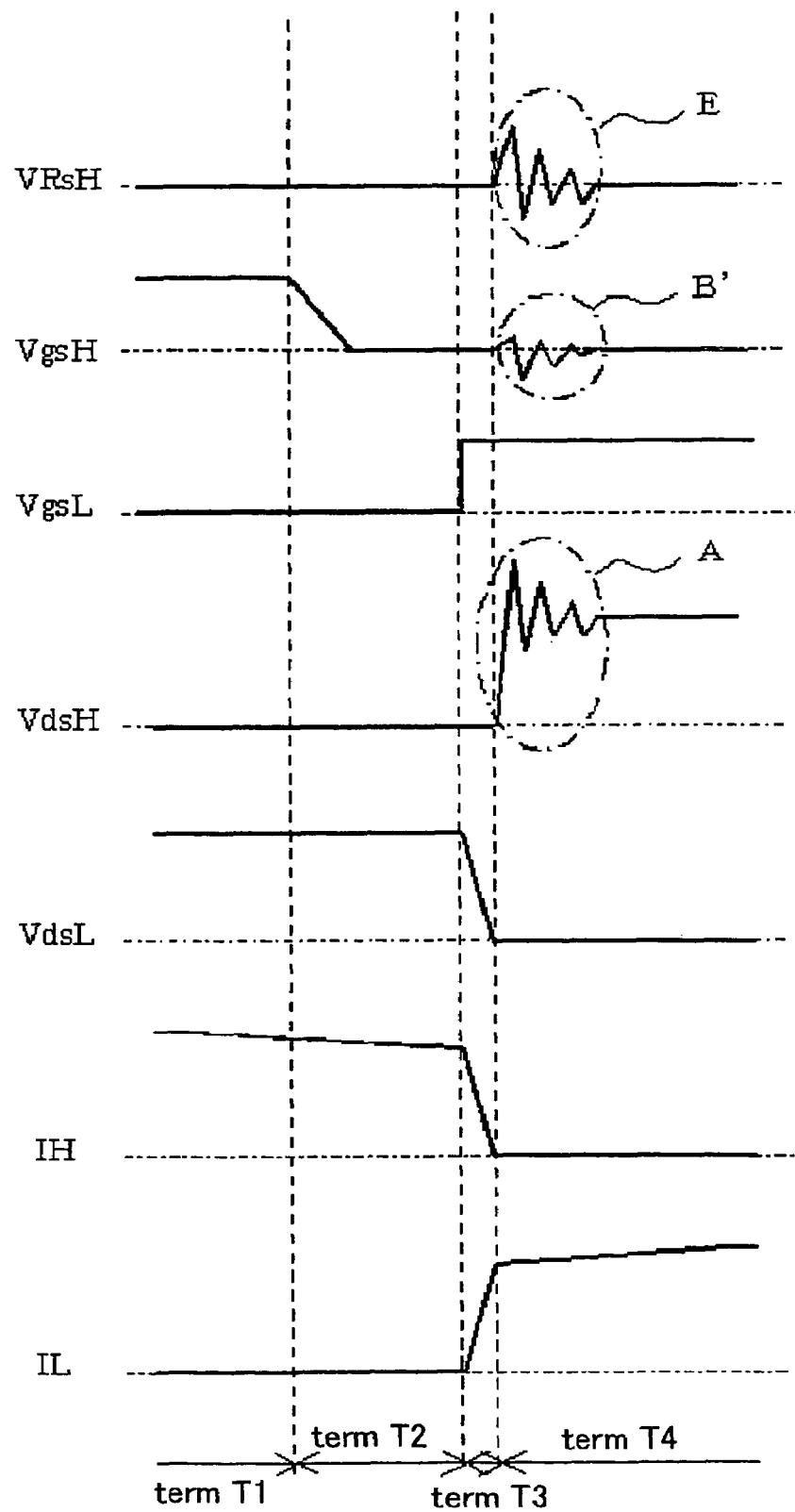
FIG. 6 is a wave form chart illustrating the operation when the main circuit switch is turned off, relevant to Embodiment 1 of the invention.

Next, the operation of the present Embodiment 1 illustrated in FIG. 1, in which the noise-suppression circuits 13 and 14 are present, will be described. In the embodiment, it is an object to reduce the noise (B in FIG. 3) generated in the voltage between the gate and the source in the turn-off operation while the reflux diode DH described above is in a reflux state. FIG. 6 illustrates waveforms of the voltages and the currents in the inverter circuit according to Embodiment 1 of the invention. In the figure, VRsH indicates the voltage generated across the first resistor Rs1H in the noise-suppression circuit 13. The other symbols are the same as in FIG. 3 and FIG. 5.

The operation during terms T1 through T3 is the same as in FIG. 3. In a term T4, when the switching of the current has been completed, high-frequency voltage fluctuations (A in FIG. 6) are generated in the voltage between the drain and the source of the high-potential-side main circuit switch SwH as described above. The high-frequency voltage fluctuations are generated also in the gate voltage of the first semiconductor switch Sw1H via the first capacitor Cs1H. The voltage generated in the gate of the semiconductor switch Sw1H is identical to the voltage VRsH generated across the first resistor Rs1H, and is determined from the impedance ratio of a parallel-connected body consisting of the gate capacitor of the first semiconductor switch Sw1H and the first resistor Rs1H, and the first capacitor Cs1H. The first semiconductor switch Sw1H repeats on-and-off operations in accordance with the voltage (=VRsH) generated in the gate of the first semiconductor switch Sw1H. More specifically, as illustrated in FIG. 6, if VRsH exceeds the threshold of the gate voltage of the first semiconductor switch Sw1H, the first semiconductor switch Sw1H is turned on at the timing when the gate voltage of the main circuit switch SwH surges, whereby a surge of the gate voltage of the main circuit switch SwH can be suppressed. (B' in FIG. 6)

Accordingly, in the turn-off operation when the reflux diode DH is in a reflux state, the main circuit switch SwH is never turned on erroneously and no short-circuit current is generated, whereby switching components are immune from heat generation and breakdown.

In the description of the embodiment of the invention, the phenomenon that occurs during the turn-off operation of the high-potential-side main circuit switch SwH has been described. However, it will be obvious that the phenomenon during the turn-off operation of the low-potential-side main circuit switch SwL is the same as in the high-potential side. Accordingly, providing the noise-suppression circuit 14 having a similar configuration can reduce heat generation of components, and can realize a highly reliable inverter circuit.

Figure 7:
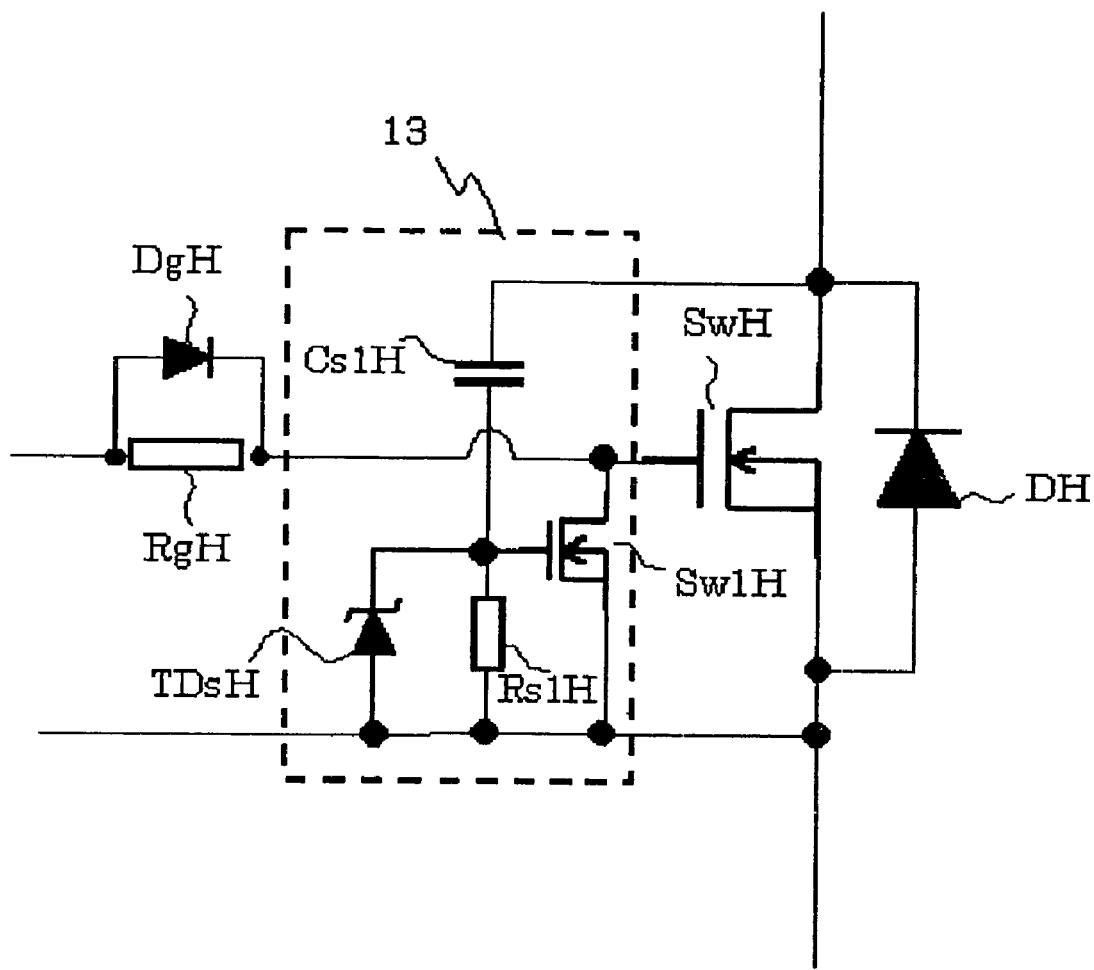
FIG. 7 is a circuit diagram illustrating a noise-suppression circuit relevant to Embodiment 1 of the invention.
Figure 8:
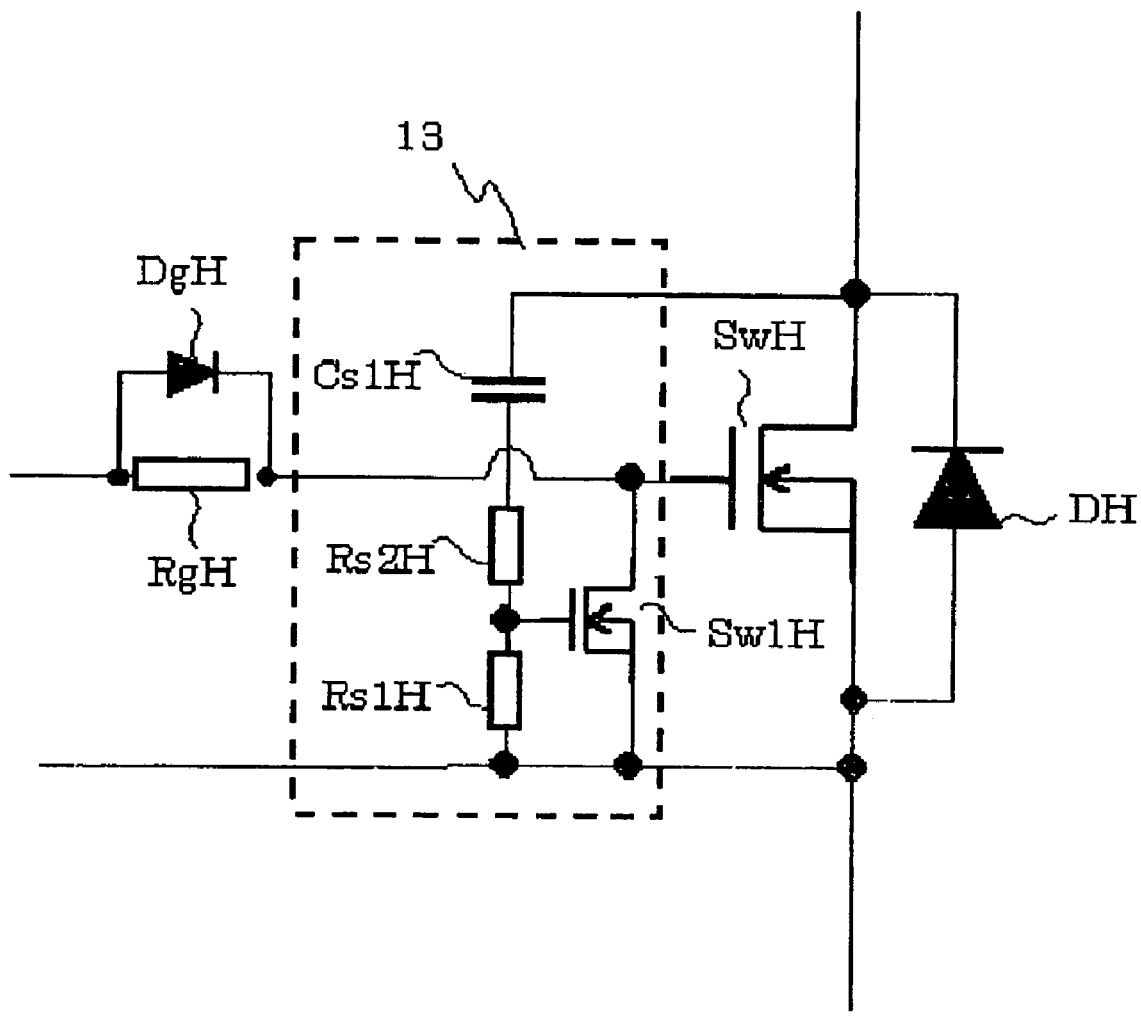
FIG. 8 is a circuit diagram illustrating another noise-suppression circuit relevant to Embodiment 1 of the invention.

In the present embodiment, the switch in the noise-suppression circuit is operated in accordance with the fluctuations generated in the voltage between the drain and the source. Depending on the amplitude of the voltage fluctuations, the voltage may exceed the withstanding voltage of the gate of the switch in the noise-suppression circuit (internal switch), and the internal switch may break down. In such a case, a Zener diode TDsH can be connected between the gate and the source of the internal switch as illustrated in FIG. 7. Alternatively, as illustrated in FIG. 8, a second resistor Rs2H can be series-connected between the first capacitor Cs1H and the first resistor Rs1H so that the voltage generated between the drain and the source of the main circuit switch SwH is divided by the first capacitor Cs1H, the second resistor Rs2H, and the first resistor Rs1H, and the voltage across the first resistor Rs1H can be applied to the gate of the first switch Sw1H.

Points of note in the present embodiment will be described. In the present embodiment, the noise-suppression circuit must be operated during the turn-off operation when the reflux diode is in a reflux state, and the noise-suppression circuit must not be operated during the turn-off operation when the current flows from the drain to the source of the main circuit switch itself. The reason is that, if the noise-suppression circuit 13 operates while the gate voltage is slowly decreasing through the gate resistor RgH during the turn-off operation, and the first semiconductor switch Sw1H is turned on, the gate voltage rapidly drops, and the surge energy that would be consumed in the main circuit switch SwH loses its pathway, rapidly charges the parasitic capacitor in the main circuit switch SwH, and raises the voltage between the drain and the source above its withstanding voltage.

Figure 9:
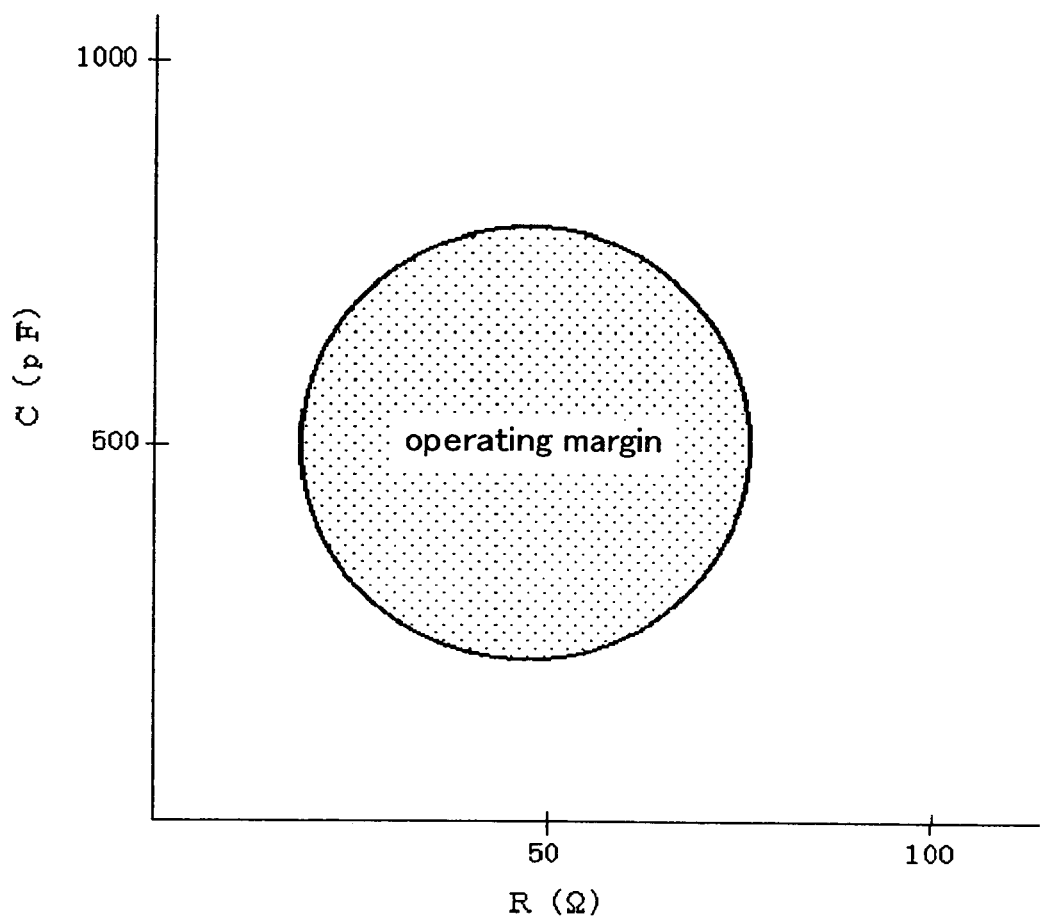
FIG. 9 is a diagram illustrating an example of an operating margin combining of a capacitance value C of a first capacitor Cs1H and the resistance value R of a first resistor Rs1H relevant to Embodiment 1 of the invention.

Therefore, in the present embodiment, the difference of gradients of rising edges of the drain-source voltage (frequency component) between the two types of turn-off operations is used to control operation/nonoperation of the noise-suppression circuit. More specifically, the fact that the gradient of the voltage during the turn-off operation from the reflux state is steep (high frequency) as indicated by A in FIG. 3 and FIG. 6, and the gradient of the voltage during the turn-off operation when the main circuit switch itself is conductive is gradual (low frequency) as indicated by D in FIG. 5 is used to control operation/nonoperation of the noise-suppression circuit. To be more precise, by adjusting the capacitance value of the first capacitor Cs1H and the resistance value of the first resistor Rs1H, operating margins can be acquired, in which the noise-suppression circuit operates when the gradient of the voltage is steep (in case of high frequencies), and the noise-suppression circuit does not operate (the first semiconductor switch is always OFF) when the gradient of the voltage is gradual (in case of low frequencies). An example of the operating margin in combination with the capacitance value C of the first capacitor Cs1H and the resistance value R of the first resistor Rs1H under a certain circuit condition is illustrated in FIG. 9. In the present embodiment, the resistance value of the first resistor Rs1H is set to 50Ω, and the capacitance value of the first capacitor Cs1H is set to 470 pF.

Because the gate driving circuit in the inverter circuit according to the embodiment is configured as described above, extra time for activating the noise-suppression circuit is not required, and power loss can be minimized.

In addition, although an inverter circuit that is connected to an inductive load has been described in the embodiment described above, by providing an inverter circuit connected to a resistive load or a capacitive load with a noise-suppression circuit as described above, fluctuations in the voltage of the gate of the main circuit switch in switching operations can be suppressed; whereby short circuiting in the main circuit switch can be prevented, and power loss in the component can be minimized.

Moreover, although, in the embodiment described above, the noise-suppression circuits 13 and 14 are provided for the inverter circuit that includes a high-potential-side arm and a low-potential-side arm, by providing an inverter circuit having only one main circuit switch with a noise-suppression circuit of the configuration similar to the inverter circuit in FIG. 1, short circuiting in the main circuit switch can be prevented, and power loss in the component can be minimized.

Furthermore, although a power MOSFET is used as a main circuit switch in the present embodiment, it will be obvious that other power semiconductor devices such as an IGBT have the same effects.

Moreover, although a MOSFET is used as a first semiconductor switch in the noise-suppression circuit in the present embodiment, it will be obvious that other semiconductor devices such as a bipolar transistor have the same effects.

Furthermore, although the configuration in which a reflux diode is connected to the main circuit switch has been described in the present embodiment, it will be obvious that a configuration using only a parasitic diode within the main circuit switch without a reflux diode has the same effects.

Embodiment 2

Figure 10:
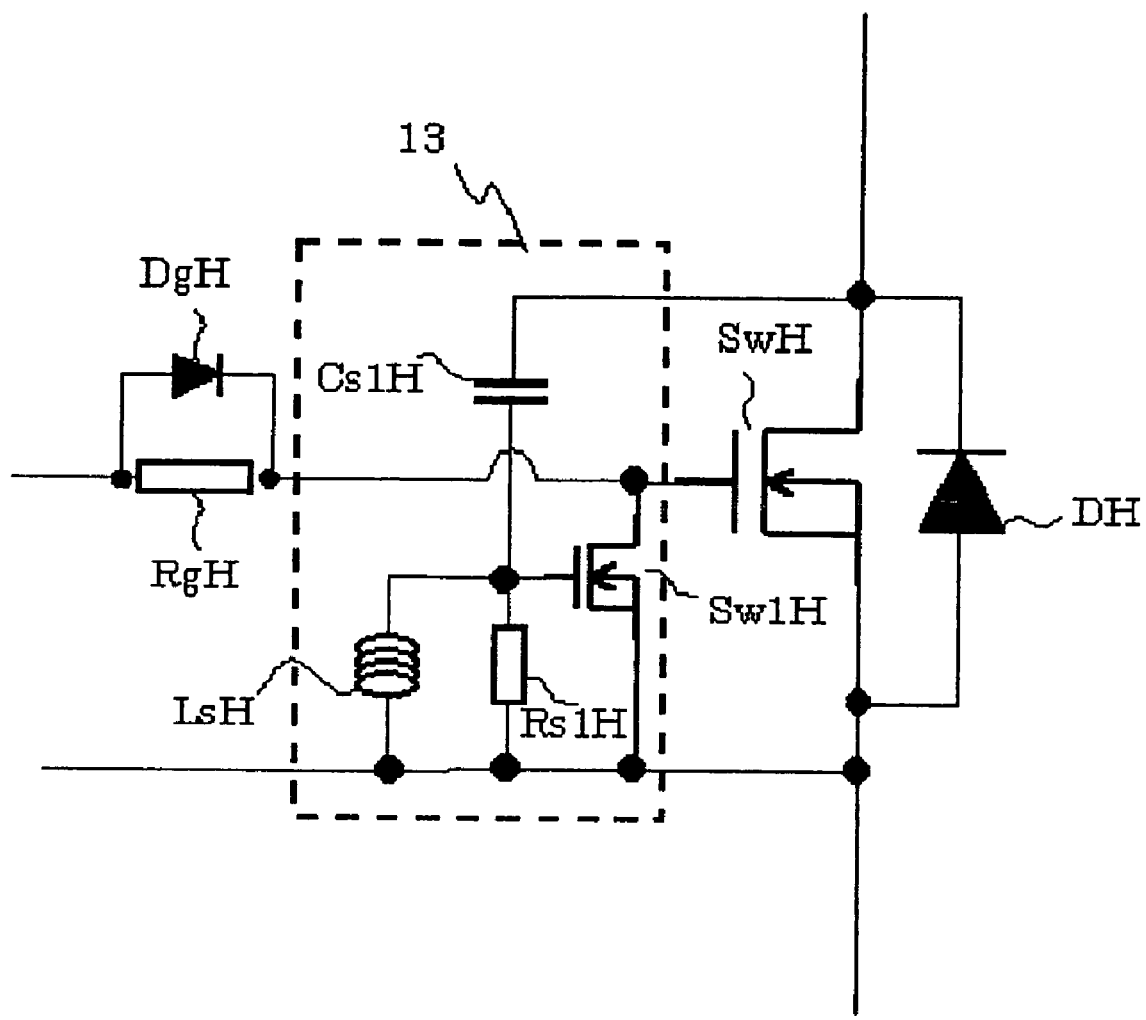
FIG. 10 is a circuit diagram illustrating a noise-suppression circuit relevant to Embodiment 2 of the invention.
Figure 11:
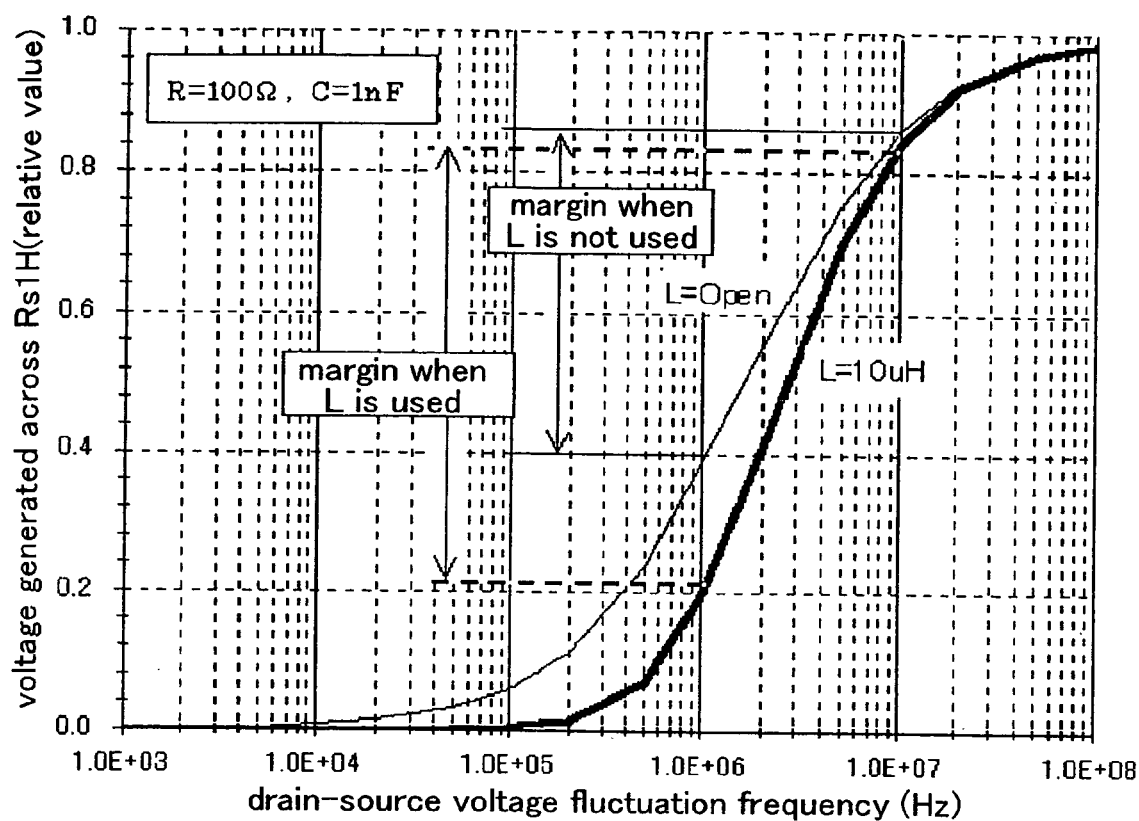
FIG. 11 is a circuit diagram illustrating an operating margin for the noise-suppression circuit relevant to Embodiment 2 of the invention.

In Embodiment 1 described above, the resistance value of the first resistor Rs1H and the capacitance value of the first capacitor Cs1H have been adjusted in order to hold the operating margin. In the present Embodiment 2, a configuration that can expand the operating margin will be described. The configuration of a noise-suppression circuit according to Embodiment 2 is illustrated in FIG. 10. Although only a high-potential-side noise-suppression circuit 13 is illustrated in FIG. 10, a low-potential-side noise-suppression circuit 14 has the same configuration. An inductor LsH is connected in parallel with the first resistor Rs1H in the noise-suppression circuit 13 in the present embodiment. Adding an inductor can expand the operating margin. FIG. 11 illustrates the effect.

In FIG. 11, under the condition that the resistance value R of the first resistor Rs1H is set to 100Ω, and the capacitance value C of the first capacitance Cs1H is set to 1 nF, relative voltages generated across the first resistor Rs1H in cases where the value L of the inductor LsH is 10 μH and where the inductor is open are illustrated with respect to the frequency of fluctuations in the voltage between the drain and the source of the main circuit switch. FIG. 11 shows that adding an inductor expands the operating margin.

For example, under the condition that the frequency component of fluctuations in the voltage between the drain and the source generated in a turn-off operation from the state in which a reflux current flows through the reflux diode for the main circuit switch is set to 10 MHz, and the frequency component of fluctuations in the voltage between the drain and the source generated in a turn-off operation from the state in which the main circuit switch is in a conductive state is set to 1 MHz, the operating margin in a case where an inductor is not used is 0.45. In contrast, the operating margin is 0.65 in a case where an inductor is used, which shows that the operating margin is expanded by just over 40%.

A large operating margin allows a wider range of values that can absorb variances in characteristics of resistors, capacitors, and switches, which is beneficial in that a wide margin is given to circuit designers.

In addition, in the present Embodiment 2, other semiconductor devices can be used as a main circuit switch and as a switch in the noise-suppression circuit as in Embodiment 1.

Moreover, connecting a Zener diode in parallel with the resistor Rs1H, or dividing the voltage inputted to the gate of the switch Sw1H using resistors are available as in Embodiment 1.

Embodiment 3

In the present Embodiment 3, a noise-suppression circuit that is devised to control operation/nonoperation of the noise-suppression circuit in the two types of turn-off operations without taking the operating margin into account as in Embodiment 1 or Embodiment 2 will be described.

Figure 12:
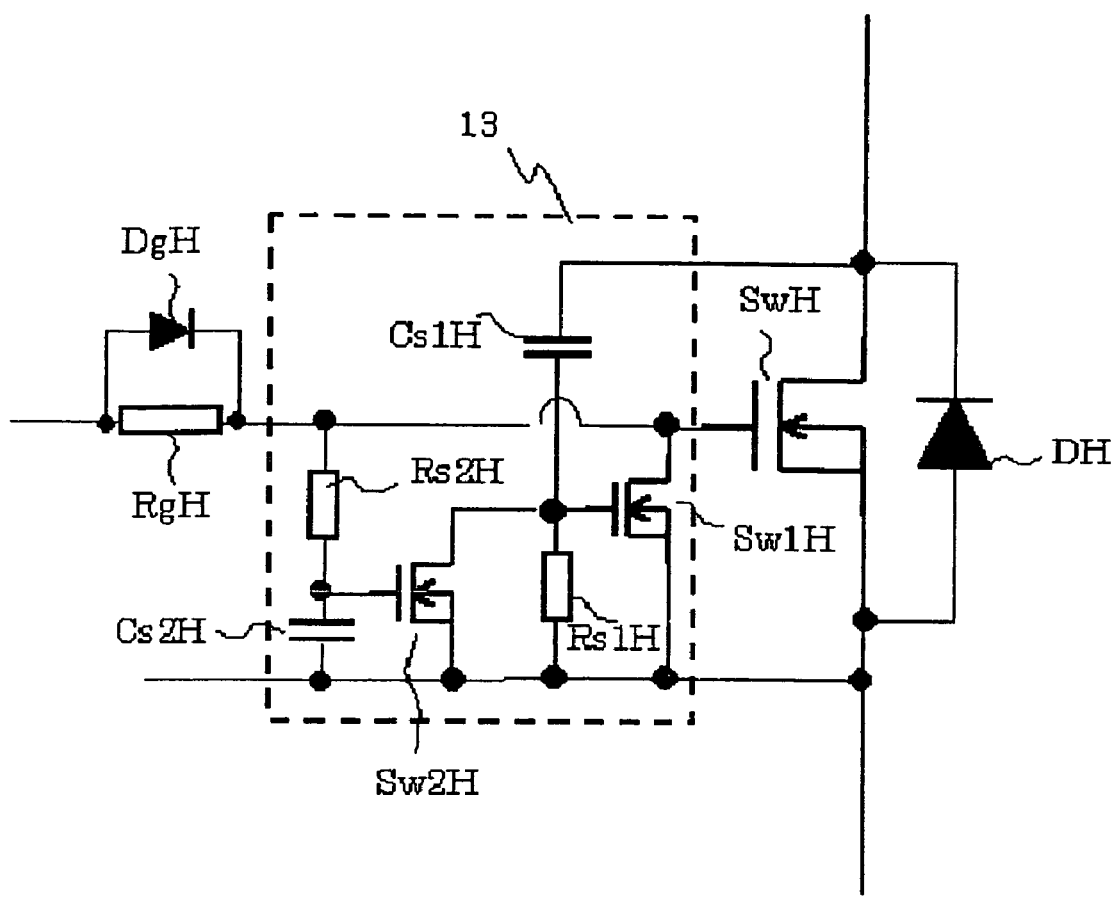
FIG. 12 is a circuit diagram illustrating a noise-suppression circuit relevant to Embodiment 3 of the invention.

The configuration of the noise-suppression circuit according to Embodiment 3 is illustrated in FIG. 12. Although only a high-potential-side noise-suppression circuit 13 is illustrated in FIG. 12, a low-potential-side noise-suppression circuit 14 has the same configuration. Added components are the following three components: a second semiconductor switch Sw2H consisting of a MOSFET, a second resistor Rs2H, and a second capacitor Cs2H. The drain of the second semiconductor switch Sw2H is connected to the gate of the first semiconductor switch Sw1H, and the source of the second semiconductor switch Sw2H is connected to the source of the first semiconductor switch Sw1H. One of the electrodes of the second resistor Rs2H is connected to the gate of the main circuit switch SwH, and the other electrode is connected to one of the electrodes of the second capacitor Cs2H and the gate of the second semiconductor switch Sw2H. The other electrode of the second capacitor Cs2H is connected to the source of the second semiconductor switch Sw2H.

In the present Embodiment 3, the difference in states of the gate voltage of the main circuit switch in the turn-off operations is used. FIG. 3 and FIG. 5 show that the gate voltage VgsH during the turn-off operation from the reflux state of the reflux diode is LOW voltage (F in FIG. 3), while the gate voltage VgsH during the turn-off operation from the conductive state of the main circuit switch itself is in a transitional state, in which the voltage is decreasing (C in FIG. 5). Accordingly, in the present Embodiment 3, by adjusting a time constant determined from the resistance value of the second resistor Rs2H and the capacitance value of the second capacitor Cs2H, the second semiconductor switch Sw2H is turned on in the turn-off operation from the conductive state of the main circuit switch itself so that the first semiconductor switch Sw1H keeps the OFF state. Meanwhile, the second semiconductor switch Sw2H is turned off in the turn-off operation from the reflux state of the reflux diode so that the first semiconductor switch Sw1H can operate in accordance with the fluctuations generated in the voltage between the drain and the source.

In addition, in the present Embodiment 3, other semiconductor devices can be used as a main circuit switch and as a switch in the noise-suppression circuit as in Embodiment 1 and Embodiment 2.

Moreover, connecting a Zener diode in parallel with the resistor Rs1H, or dividing the voltage inputted to the gate of the switch Sw1H using resistors are available as in Embodiment 1 and Embodiment 2.

As described above, according to the present invention, in an inverter circuit configured with main circuit switches each having a control terminal and first and second main terminals through which the main current flows, and driving circuits each of which applies the driving voltage to the control terminal of the main circuit switch, and controls the main current in accordance with the voltage between the control terminal and the first main terminal, to switch the main circuit switch, between each main circuit switch and each driving circuit, a noise-suppression circuit is provided so as to detect fluctuations in the voltage between the first and the second main terminals of the main circuit switch, and to bring to approximately zero the impedance across the control terminal of the main circuit switch and the first main terminal of the main circuit switch in accordance with the amplitude and the frequency of the detected voltage fluctuations, whereby there is a benefit in that heat generation of components in the noise-suppression circuit can be reduced, and extra time for activating the noise-suppression circuit is not required.

What is claimed is:

1. An inverter circuit comprising:
at least one main circuit switch having a control terminal, and first and second main terminals through which the main current flows;
a driving circuit for each main circuit switch, for applying a driving voltage to the control terminal thereof, and controlling the main current in accordance with the voltage between the control terminal and the first main terminal, to switch each main circuit switch; and
a noise-suppression circuit for each main circuit switch, between each main circuit switch and each driving circuit, that is configured to detect fluctuations in the voltage between the first and the second main terminals of each main circuit switch, and, in accordance with the amplitude and the frequency of the detected voltage fluctuations, to bring to substantially zero the impedance across the control terminal of each main circuit switch and the first main terminal of each main circuit switch, wherein:
the driving circuit is series connected to the noise-suppression circuit, which is connected to control terminal of the main circuit switch, by a component comprising a resistor connected in parallel to a diode and wherein the noise-suppression circuit is series connected to the control terminal of the main circuit switch,
a cathode of the diode is connected to the control terminal of the main circuit switch,
the noise-suppression circuit comprises a first capacitor, a first resistor, and a first semiconductor switch that has a control terminal and two main terminals through which the main current flows,
the first capacitor and the first resistor are connected in series,
the first capacitor and the first resistor in series as a component are connected between the first main terminal and the second main terminal of the main circuit switch,
the control terminal of the first semiconductor switch is connected to a point where the first capacitor and the first resistor connect,
one of the main terminals of the first semiconductor switch is connected to the control terminal of the main circuit switch,
the other of the main terminals of the first semiconductor switch is connected to the first main terminal of the main circuit switch,
the noise-suppression circuit further comprises a second resistor, a second capacitor, and a second semiconductor switch,
the second resistor and the second capacitor in series as a component are connected in parallel between the two main terminals of the first semiconductor switch,
the control terminal of the second semiconductor switch is connected to a point where the second resistor and the second capacitor connect,
one of the two main terminals of the second semiconductor switch is connected to the control terminal of the first semiconductor switch, and
the other of the two main terminals of the second semiconductor switch is connected to the one main terminal, out of the two main terminals of the first semiconductor switch, that is connected to the first main terminal of the main circuit switch.

2. The inverter circuit according to claim 1, wherein
the inverter circuit comprises two of the main circuit switches, connected in series;
an inductive load is connected to a point where the two main circuit switches connect; and
the capacitance of the first capacitor and the resistance of the first resistor in each of the noise-suppression circuits are set at values so that each noise-suppression circuit operates only when the main current flows from the first main terminal to the second main terminal of each of the main circuit switches.

3. The inverter circuit according to claim 2, wherein each of the noise-suppression circuits further comprises an inductor connected in parallel with the first resistor and in series with the first capacitor.

4. The inverter circuit according to claim 1, wherein
the inverter circuit comprises two of the main circuit switches, connected in series;
an inductive load is connected to a point where the two main circuit switches connect; and
the voltage of the control terminal of the first semiconductor switch in each of the noise-suppression circuits is controlled by the control-terminal voltage in each of the main circuit switches.

5. An inverter circuit comprising:
- at least one main circuit switch having a control terminal, and first and second main terminals through which the main current flows;
- a driving circuit for each main circuit switch, for applying a driving voltage to the control terminal thereof, and controlling the main current in accordance with the voltage between the control terminal and the first main terminal, to switch each main circuit switch;
- a noise-suppression circuit for each main circuit switch, between each main circuit switch and each driving circuit, that is configured to detect fluctuations in the voltage between the first and the second main terminals of each main circuit switch, and, in accordance with the amplitude and the frequency of the detected voltage fluctuations, to bring to substantially zero the impedance across the control terminal of each main circuit switch and the first main terminal of each main circuit switch, wherein:
- the noise-suppression circuit comprises a first capacitor, a first resistor, and a first semiconductor switch that has a control terminal and two main terminals through which the main current flows,
- the first capacitor and the first resistor are connected in series,
- the first capacitor and the first resistor in series as a component are connected between the first main terminal and the second main terminal of the main circuit switch,
- the control terminal of the first semiconductor switch is connected to a point where the first capacitor and the first resistor connect,
- one of the main terminals of the first semiconductor switch is connected to the control terminal of the main circuit switch,
- the other of the main terminals of the first semiconductor switch is connected to the first main terminal of the main circuit switch,
- the inverter circuit further comprises two of the at least one main circuit switch connected in series,
- an inductive load is connected to a point where the two main circuit switches connect,
- the voltage of the control terminal of the first semiconductor switch in each of the noise-suppression circuits is controlled by the control-terminal voltage in each of the main circuit switches,
- each of the noise-suppression circuits further comprises a second resistor, a second capacitor, and a second semiconductor switch,
- the second resistor and the second capacitor in series as a component are connected in parallel between the two main terminals of the first semiconductor switch,
- the control terminal of the second semiconductor switch is connected to a point where the second resistor and the second capacitor connect,
- one of the two main terminals of the second semiconductor switch is connected to the control terminal of the first semiconductor switch, and
- the other of the two main terminals of the second semiconductor switch is connected to the one main terminal, out of the two main terminals of the first semiconductor switch, that is connected to the first main terminal of the main circuit switch.

6. The inverter circuit according to claim 2, wherein the first main terminal of the main circuit switch in a high-potential side noise-suppression circuit connects to the inductive load and the second main terminal connects to a voltage source, and wherein the first main terminal of the main circuit switch in a low-potential side noise-suppression circuit connects to a ground and the second main terminal connects to the inductive load.

7. The inverter circuit according to claim 3, wherein the inductor connects between the control terminal of the first semiconductor switch and the first main terminal of the main circuit switch.

8. The inverter circuit according to claim 4, wherein low-frequency or direct current voltage of the control terminal of the first semiconductor switch in each of the noise-suppression circuits is controlled by the control-terminal voltage in each of the main circuit switches.

9. The inverter circuit according to claim 1, wherein the first semiconductor switch is a MOSFET switch.

10. The inverter circuit according to claim 1, wherein the anode of the diode is connected to the driving circuit.

* * * * *